(12) United States Patent
Wang et al.

(10) Patent No.: US 9,224,589 B2
(45) Date of Patent: Dec. 29, 2015

(54) METHOD FOR ELIMINATING CONTACT BRIDGE IN CONTACT HOLE PROCESS

(75) Inventors: Guilei Wang, Beijing (CN); Junfeng Li, Beijing (CN); Chao Zhao, Kessel-lo (BE)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 298 days.

(21) Appl. No.: 13/497,768

(22) PCT Filed: Nov. 28, 2011

(86) PCT No.: PCT/CN2011/001977
§ 371 (c)(1),
(2), (4) Date: Mar. 22, 2012

(87) PCT Pub. No.: WO2013/013362
PCT Pub. Date: Jan. 31, 2013

(65) Prior Publication Data
US 2013/0213434 A1    Aug. 22, 2013

(30) Foreign Application Priority Data
Jul. 25, 2011 (CN) .......................... 2011 1 0208407

(51) Int. Cl.
*H01L 21/02* (2006.01)
*H01L 21/768* (2006.01)
*C23C 16/44* (2006.01)
*C23C 16/30* (2006.01)
*C23C 16/34* (2006.01)
*C23C 16/40* (2006.01)
*C23C 16/505* (2006.01)
*C23C 16/56* (2006.01)

(52) U.S. Cl.
CPC .............. *H01L 21/02* (2013.01); *C23C 16/308* (2013.01); *C23C 16/345* (2013.01); *C23C 16/402* (2013.01); *C23C 16/4404* (2013.01); *C23C 16/505* (2013.01); *C23C 16/56* (2013.01); *H01L 21/76837* (2013.01)

(58) Field of Classification Search
None
See application file for complete search history.

(56) References Cited

U.S. PATENT DOCUMENTS

| 4,581,301 | A | * | 4/1986 | Michaelson ................ 428/551 |
| 6,071,573 | A | | 6/2000 | Koemtzopoulos et al. |
| 2003/0180459 | A1 | * | 9/2003 | Redeker et al. ............ 427/248.1 |
| 2004/0075910 | A1 | * | 4/2004 | Shozude ................ G02B 1/115 359/603 |
| 2005/0193949 | A1 | | 9/2005 | Paisant |
| 2005/0250340 | A1 | * | 11/2005 | Chen et al. .................... 438/758 |
| 2006/0008676 | A1 | * | 1/2006 | Ebata et al. .................... 428/698 |
| 2006/0269692 | A1 | * | 11/2006 | Balseanu et al. ............. 427/569 |
| 2013/0220410 | A1 | * | 8/2013 | Haas et al. .................... 136/256 |

FOREIGN PATENT DOCUMENTS

JP    9-268367 A    10/1997

* cited by examiner

Primary Examiner — Nicole Blan
(74) Attorney, Agent, or Firm — Treasure IP Group, LLC

(57) ABSTRACT

A method for eliminating contact bridge in a contact hole process is disclosed, wherein a cleaning menu comprising a multi-step adaptive protective thin film deposition process is provided, so that a stack adaptive protective thin film is formed on the sidewall of the chamber of the HDP CVD equipment. The stack adaptive protective thin film has good adhesivity, compactness and uniformity to protect the sidewall of the chamber of the HDP CVD equipment from being damaged by the plasma, and avoid the generation of defect particles, thereby improving the HDP CVD technical yield and eliminating the contact bridge phenomenon in the contact hole process.

8 Claims, 5 Drawing Sheets

US 9,224,589 B2

METHOD FOR ELIMINATING CONTACT BRIDGE IN CONTACT HOLE PROCESS

CROSS REFERENCE TO RELATED APPLICATION

This application is a National Phase application of, and claims priority to, PCT Application No. PCT/CN2011/001977, filed on Nov. 28, 2011, entitled "METHOD FOR ELIMINATING CONTACT BRIDGE IN CONTACT HOLE PROCESS", which claimed priority to Chinese Application No. CN201110208407.X, filed on Jul. 25, 2011. Both the PCT Application and Chinese Application are incorporated herein by reference in their entireties.

FIELD OF THE INVENTION

The present invention relates to the field of manufacture of a semiconductor integrated circuit, particularly to a method for eliminating contact bridge in a contact hole process.

BACKGROUND OF THE INVENTION

As the semiconductor integrated circuit development follows a schedule predicted by Moore's law, the device feature size becomes smaller and more integrated. With continuous miniaturization in the feature size, the single chip has achieved an integration level as high as $10^8 \sim 10^9$, and meanwhile, more and more requirements are posed on the production technique, thus reducing defect size and density becomes very crucial in the manufacture process. A 1 micron dust may not be a problem to a transistor of 100 micron in size, but it will be a fatal defect causing device failure to a transistor of 1 micron, hence much higher requirements are raised to the chemical vapor deposition (CVD) thin film recipe. Making 90 nm or 60 nm devices under the same thin film deposition process, the negative impact of 10 defects in same size on the yield of 90 nm products is less than 2% but on 65 nm products, is more than 30%.

In the current CVD recipe, defects caused by the high density plasma chemical vapor deposition (HDP CVD) recipe, such as HDP CVD recipe of shallow trench isolation (STI) dielectrics and HDP CVD recipe of phosphosilicate glass (PSG) as an interlayer dielectric (ILD) layer are most serious. In the current recipe, block defects will be produced if the HDP CVD process of PSG as an ILD is not well controlled, causing contact bridge in the following recipe, thus resulting in a product failure, referring to FIGS. 1-4 for details.

FIG. 1 shows a typical CMOS structure with an ILD. On substrate 10 an N well 11 and a P well 12 separated by an STI structure 13 are disposed. NMOS and PMOS have source/drain 22 and gate 21. An ILD 14 formed by an HDP CVD process covers the NMOS and PMOS enclosed by the strained SiN. A defect 15, such as a contaminant particle unpredictable in the process, exists in the ILD 14. When the ILD 14 is formed, the defect 15 is removed by washing and chemical mechanical polishing (CMP), but a hole 16 is left in the ILD 14, referring to FIG. 2. Then, referring to FIG. 3, through the ILD 14, multiple contact holes 17 are formed to expose electrodes out. Next, referring to FIG. 4, conductive materials such as Ti/TiN are filled to form contact plugs 19 in contact holes 17, but having some conductive materials left in holes 16 at the same time, thus a bridge unit 18 is formed. Due to storage of the bridge unit 18, multiple contact plugs 19 are bridged to be short-circuited, thereby resulting in a circuit failure.

Therefore, in accordance with the further requirement on the HDP CVD technical yield posed by the current semiconductor recipe, there is a need to develop a method for eliminating contact bridge in a contact hole process to reduce the defects produced in the HDP CVD deposition process, thereby avoiding a circuit failure.

SUMMARY OF THE INVENTION

Provided in the present invention is a method for eliminating contact bridge in a contact hole process, comprising: cleaning the reaction chamber of a high density plasma chemical vapor deposition (HDP CVD) equipment, the cleaning process comprising setting a cleaning menu, in the menu, after removing the $SiO_2$ thin film grown on the wall of the reaction chamber, setting a multi-step adaptive protective thin film deposition process to form a stack adaptive protective thin film over the chamber wall for protecting it from the damage caused by the plasma in the HDP CVD process.

In the method of the present invention, the material for the adaptive protective thin film is one or more materials selected from a group consisting of $SiO_2$, $Si_3N_4$, and SiON.

In the method of the present invention, the stack adaptive protective thin film is a stack formed by one or more materials selected from a group consisting of thin films of $SiO_2$, $Si_3N_4$, and SiON. Preferably, the stack adaptive protective thin film is a stack formed by multiple layers of $SiO_2$. More preferably, the stack adaptive protective thin film is a stack formed by multiple layers of silicon enriched $SiO_2$ with a refractive index greater than 1.5, or the stack adaptive protective thin film is a stack formed by multiple layers of oxygen enriched $SiO_2$ with a refractive index smaller than 1.5, wherein in the multi-step adaptive protective thin film forming process, the ratio of gas flow of $SiH_4$ and $O_2$ used by the thin film deposition are alternatively changed to obtain thin film coverage of different refractive index components, thereby improving the compactness of the adaptive protective thin film.

In the method of the present invention, in the multi-step adaptive protective thin film forming process, the parameters of RF power used by the thin film deposition are alternatively changed to improve the uniformity and compactness of the adaptive protective thin film. Preferably, the changed RF power parameters comprises changing the plasma distribution concentration and direction.

The method of the present invention further comprises, after depositing one or any number of layers of adaptive protective thin films, scraping the sidewall of the chamber to increase the roughness while maintaining the chamber, improving the surface performance, thereby increasing the adhesivity of the adaptive protective thin film.

The present invention comprises a cleaning menu of the multi-step adaptive protective thin film deposition process, so as to form a stack adaptive protective thin film on the sidewall of the chamber of the HDP CVD equipment. The stack adaptive protective thin film has good adhesivity, compactness and uniformity to both protect the sidewall of the chamber of the HDP CVD equipment from damage of the plasma and avoid generation of defect particles, thereby improving the technical yield of HDP CVD process and eliminating the contact bridge phenomenon in the contact hole process.

DETAILED DESCRIPTION OF THE EMBODIMENTS

Figure 1:
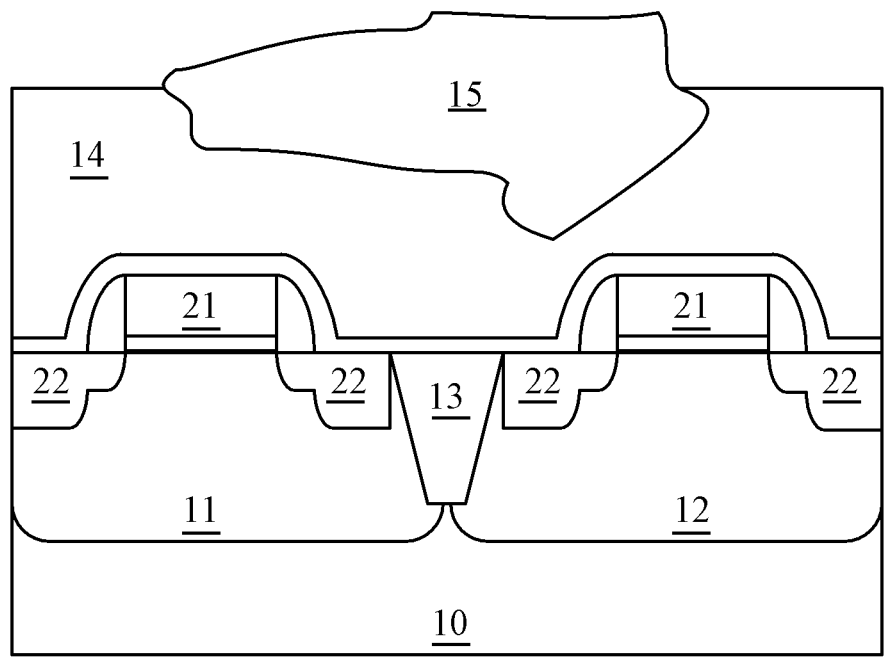
FIGS. 1-4 are schematic diagrams illustrating the contact bridge phenomenon.
Figure 2:
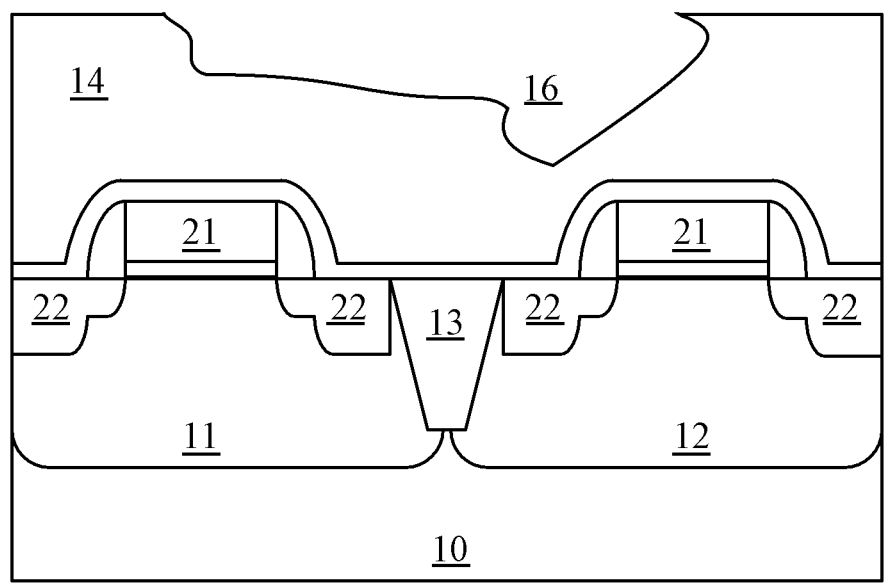
Figure 3:
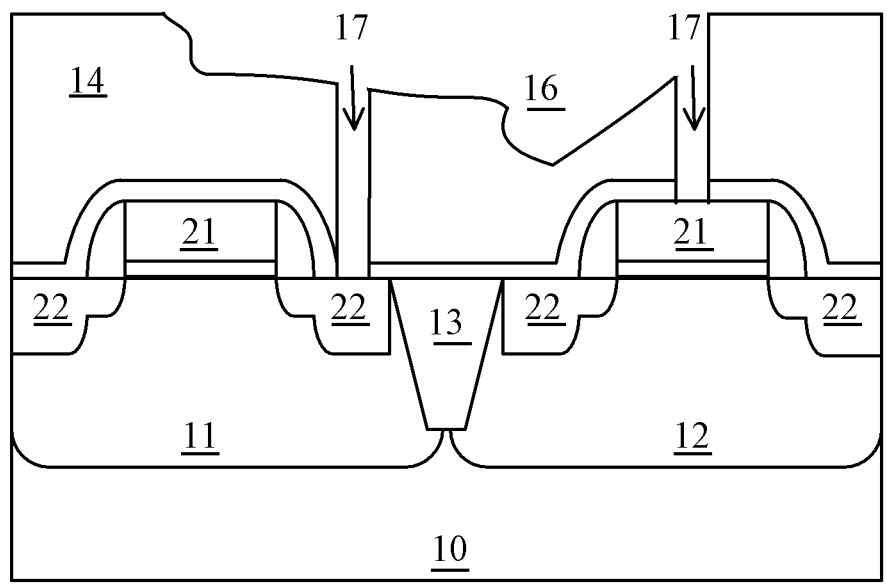

The present invention is described with the specific embodiments as illustrated in the drawings below. However, it should be appreciated that these descriptions are only illustrative, which do not intend to limit the present invention. Furthermore, the descriptions of common structures and techniques are omitted in the explanation below to avoid unnecessary confusion of the concept of the present invention.

The embodiment of the present invention relates to a dry cleaning process after performing a dielectric thin film deposition by a high density plasma chemical vapor deposition (HDP CVD) method, to meet the perfect particles requirement on the surface of the deposited wafer, thereby improving the technical yield of HDP CVD process and eliminating the contact bridge phenomenon in the contact hole process.

Figure 9:
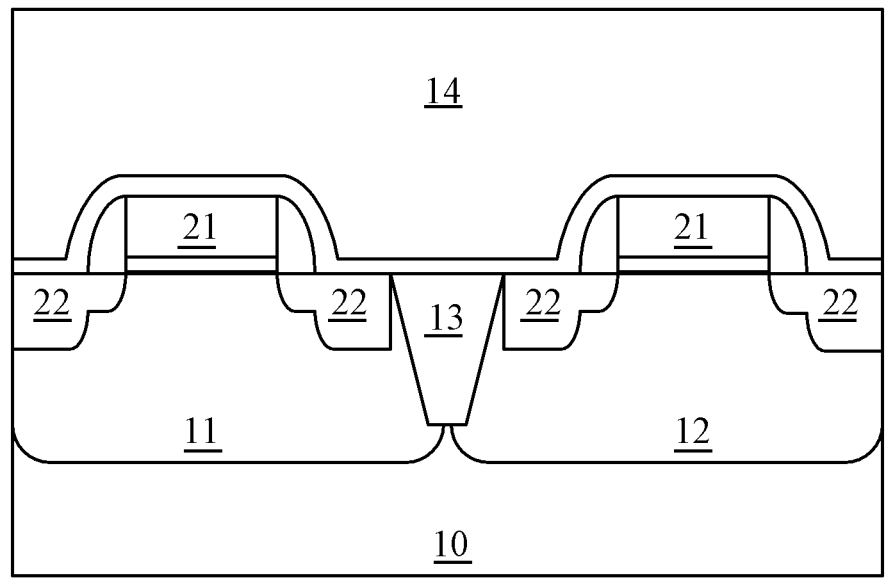
FIGS. 9-10 show the semiconductor device without contact bridge as provided by the present invention.

In accordance with the present invention, referring to FIG. 9, first, there is provided a semiconductor substrate 10, on which an N-well 11, a P-well 12, and an isolation structure 13 such as an STI structure for isolating the N-well 11 and the P-well 12 are disposed. Source/drain 22 of NMOS and PMOS are formed in the well regions, and gates 21 are formed on the substrate 10. Then, the NMOS and PMOS are conformably covered with strained SiN. Next, an interlayer dielectric layer (ILD) 14 is formed on the strained SiN to cover the NMOS and PMOS regions. Thereafter, multiple contact holes 17 are formed through the ILD 14 so as to introduce source/drain and gate electrodes.

Figure 5:
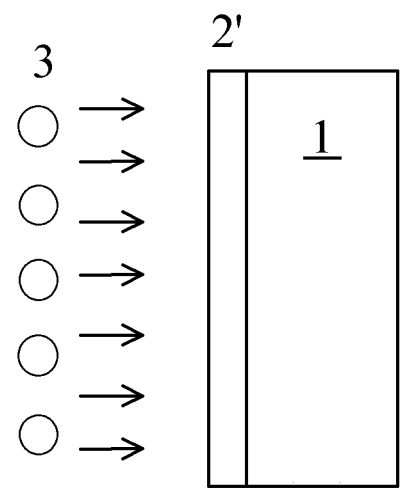
FIGS. 5-6 are schematic diagrams illustrating the mechanism for defect generation.
Figure 6:
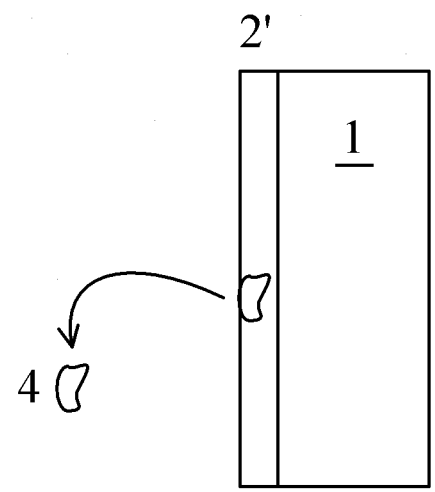

Compared to the traditional plasma enhanced chemical vapor deposition (PECVD) technique, the HDP CVD deposition technique, under a lower pressure, may use an inductive coupling (ICP) mode to generate high density plasma or use an electron cyclotron resonance (ECR) mode to generate high density plasma, or use other modes such as surface wave and Whistler wave to generate high density plasma. The PECVD deposition mode has plasma with a density of $10^8 \sim 10^{10}$ (n/cm$^3$), however, if an HDP CVD deposition mode is used, the plasma with a density of $10^{11} \sim 10^{12}$ (n/cm$^3$) or even higher order of magnitude can be achieved. Since HDP CVD is a process where deposition and sputtering (etching) are simultaneously performed, the high density plasma may also have certain bombardment effect on the reactive chamber. Referring to FIG. 5, a layer of thin film 2' is formed on the sidewall 1 of the reactive chamber when the HDP CVD process is performed. However, generally the surface performance of the chamber deteriorates due to long time plasma bombardment, besides, the compactness and uniformity of the thin film 2' are not good, so, if plasma 3 bombards the surface of the thin film 2', possibly the defect 3, for example, in a particle shape, will be hit from the thin film 2' (see FIG. 6) and will fall in the layer of ILD 14 to render the situation as shown in FIG. 1. In order to reduce defects and improve the yield of the semiconductor device, a cleaning process shall be performed to eliminate the factors that may cause defects when manufacturing the desired thin film such as the ILD 14 in this embodiment.

Figure 7:
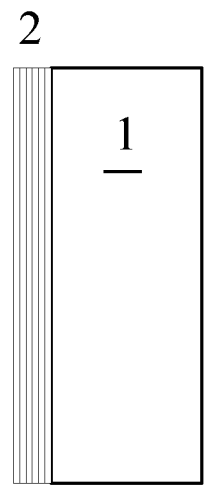
FIG. 7 shows the stack protective layer provided by the present invention.

The method of eliminating the contact bridge in the contact hole process in the present invention comprises a new developed cleaning process. When a desired thin film is manufactured by a HDP CVD process, for example, a deposited ILD layer, the chamber of the HDP CVD equipment is cleaned by a process of setting a cleaning menu, wherein a multi-step adaptive protective thin film deposition process is set to form a stack adaptive protective thin film 2 on the sidewall of the chamber, referring to FIG. 7, the stack adaptive protective thin film 2 protects the sidewall of the chamber from being damaged by the plasma in the HDP CVD process.

Upon factory production or laboratory experiment, usually a batch of dummy wafers will be first taped out such that the chamber where the HDP CVD reaction occurs gradually enters into a stable status, then wafer tape out production or experiment will be carried out in a large scale. In the cleaning process of the present invention, the adaptive protective thin film is deposited on the chamber wall by performing an adaptive protective thin film deposition (also known as thin film deposition in the flow, i.e., season thin film deposition) process in the cleaning menu to protect the chamber wall and maintain a stable reaction environment for growth of a next wafer or a next batch of wafers.

In the method of the present invention, the material for the adaptive protective thin film may be one or more materials selected from a group consisting of $SiO_2$, $Si_3N_4$, and SiON. What kind of materials shall be adopted depends on the ILD layer, because the material for the adaptive protective thin film is the same as that of the ILD layer. Thus, the stack adaptive protective thin film 2 is a stack formed by one or more materials selected from a group consisting of the thin films of $SiO_2$, $Si_3N_4$, and SiON. In a preferred example, when the ILD layer 14 is a layer of $SiO_2$, the stack adaptive protective thin film 2 is a stack formed by multiple layers of $SiO_2$. In a more preferred example, the stack adaptive protective thin film 2 is a stack formed by multiple layers of silicon enriched $SiO_2$ with a refractive index greater than 1.5, or the stack adaptive protective thin film 2 is a stack formed by multiple layers of oxygen enriched $SiO_2$ with a refractive index less than 1.5. In the multi-step process for forming the adaptive protective thin film 2, the ratio of gas flow of $SiH_4$ and $O_2$ used by the thin film deposition are alternatively changed to obtain thin film coverage of different refractive index components, thereby improving the compactness of the adaptive protective thin film.

In the method of the present invention, in the multi-step process for forming the adaptive protective thin film 2, the parameters of the RF power used by HDP CVD thin film deposition are alternatively changed to improve the adhesivity, uniformity and compactness of the adaptive protective thin film 2. Preferably, changing the RF power parameters comprises changing the plasma distribution concentration and direction.

Figure 8:
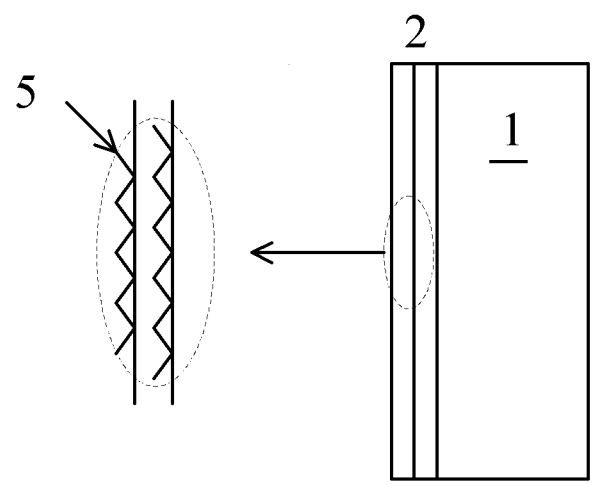
FIG. 8 shows the polished stack protective layer provided by the present invention.

The method of the present invention further comprises, after depositing one or any number of layers of adaptive protective thin films 2, scraping the sidewall of the chamber to increase the roughness while maintaining the chamber, improving the surface performance, thereby increasing the adhesivity of the adaptive protective thin film. Referring to FIG. 8, the scraped thin film has a rough surface 5 to thus provide good adhesive ability and improve the adhesivity of the entire stack adaptive protective thin film 2 such that it may not be easily dropped off by the plasma bombardment, thereby further reducing the possibility of producing defects.

Figure 4:
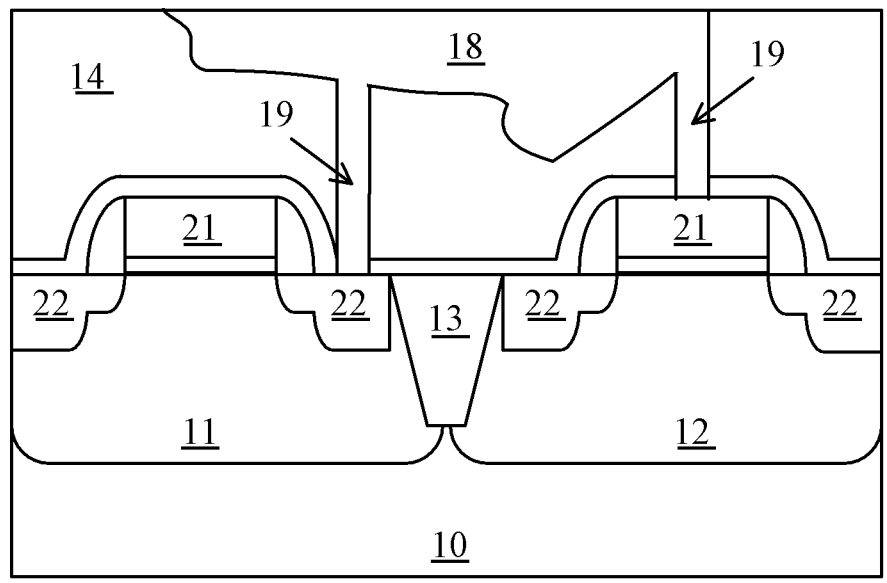
Figure 10:
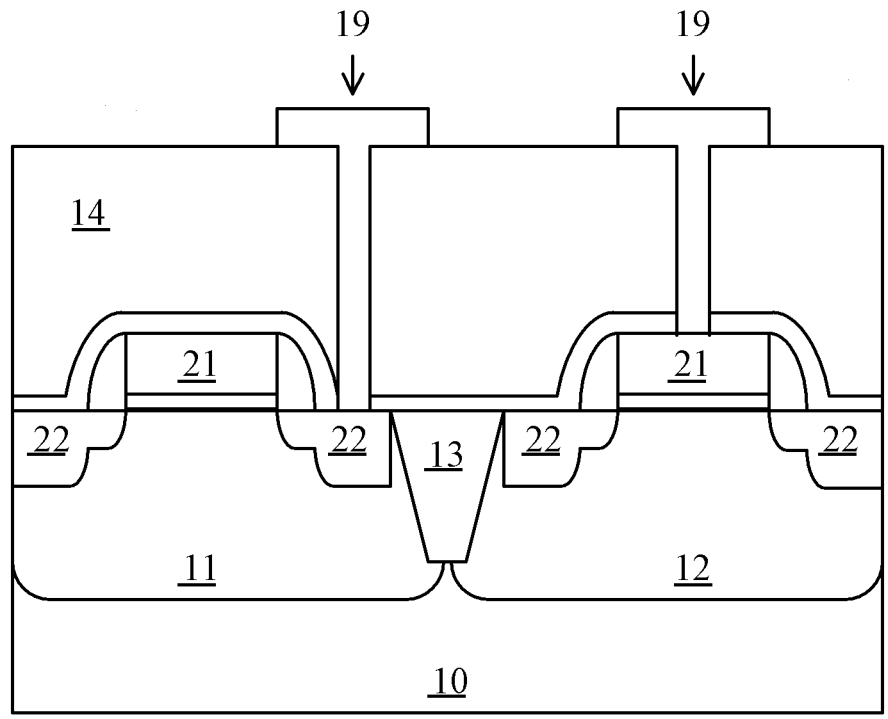

Since the cleaning process of the present invention is performed, no defects will be produced at the surface of the ILD 14, thus the contact bridge phenomenon that may be arisen in the subsequent contact hole filling process is eliminated. Next, referring to FIG. 10, conductive materials such as Ti/TiN are filled to form contact plugs 19 in the contact holes 17. At that time, no bridge unit 18 as shown in FIG. 4 exists in the semiconductor device, so the circuit function is guaranteed, and the yield of the integrated circuit is enhanced.

In the present invention, a cleaning menu comprising a multi-step adaptive protective thin film deposition process is disclosed, so that a stack adaptive protective thin film is formed on the sidewall of the chamber of the HDP CVD equipment. The stack adaptive protective thin film has good compactness and uniformity to protect the sidewall of the chamber of the HDP CVD equipment from damage of the plasma and avoid the generation of defect particles, thereby improving the HDP CVD technical yield and eliminating the contact bridge phenomenon in the contact hole process.

The present invention has been described with reference to the embodiments thereof. However, these embodiments are intended to be illustrative, but not to limit the scope of the invention. The scope of the invention is defined by the attached claims as well as their equivalents. Many substitutions and modifications can be made by those skilled in the art without departing from the scope of the present invention, and such substitutions and modifications shall fall within the scope of the present invention.

What is claimed is:

1. A method for eliminating contact bridge in a contact hole process, characterized in comprising: cleaning a chamber of a high density plasma chemical vapor deposition (HDP CVD) equipment, the cleaning process comprising setting a cleaning menu, in the menu setting a multi-step adaptive protective thin film deposition process to form a stack adaptive protective thin film over the sidewall of the chamber to protect it from being damaged by the plasma in the HDP CVD process, wherein the stack adaptive protective thin film is deposited during the chamber cleaning process, instead of being completely removed, wherein the stack adaptive protective thin film is a stack formed by multiple layers of $SiO_2$, and wherein in the multi-step adaptive protective thin film deposition process, ratio of gas flow of $SiH_4$ and $O_2$ used by the thin film deposition are alternatively changed to obtain thin film coverage of different refractive index components, thereby improving the compactness of the adaptive protective thin film.

2. The method according to claim 1, wherein the stack adaptive protective thin film is a stack formed by multiple layers of silicon enriched $SiO_2$ with a refractive index greater than 1.5.

3. The method according to claim 1, wherein the stack adaptive protective thin film is a stack formed by multiple layers of oxygen enriched $SiO_2$ with a refractive index smaller than 1.5.

4. The method according to claim 1, wherein in the multi-step adaptive protective thin film forming process, the parameters of RF power used by the thin film deposition are alternatively changed to improve the uniformity and compactness of the adaptive protective thin film.

5. The method according to claim 4, wherein changing the RF power parameters comprises changing the plasma distribution concentration and direction.

6. The method according to claim 1, after depositing one or more layers of adaptive protective thin films, further comprising the steps of: scraping the sidewall of the chamber to increase the roughness while maintaining the chamber, improving the surface performance, thereby increasing the adhesivity of the adaptive protective thin film.

7. The method according to claim 2, wherein in the multi-step adaptive protective thin film forming process, ratios of gas flow of $SiH_4$ and $O_2$ used by the thin film deposition are alternatively changed to obtain thin film coverage of different refractive index components, thereby improving the compactness of the adaptive protective thin film.

8. The method according to claim 3, wherein in the multi-step adaptive protective thin film forming process, ratios of gas flow of $SiH_4$ and $O_2$ used by the thin film deposition are alternatively changed to obtain thin film coverage of different refractive index components, thereby improving the compactness of the adaptive protective thin film.

\* \* \* \* \*